United States Patent
Kawai et al.

(10) Patent No.: US 9,564,426 B2
(45) Date of Patent: Feb. 7, 2017

(54) SEMICONDUCTOR DEVICE AND METHOD OF MANUFACTURING THE SAME

(71) Applicant: Renesas Electronics Corporation, Tokyo (JP)

(72) Inventors: Tohru Kawai, Ibaraki (JP); Yasutaka Nakashiba, Ibaraki (JP); Yutaka Akiyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/931,991

(22) Filed: Nov. 4, 2015

(65) Prior Publication Data

US 2016/0204099 A1 Jul. 14, 2016

(30) Foreign Application Priority Data

Jan. 13, 2015 (JP) ................. 2015-004147

(51) Int. Cl.
| | |
|---|---|
| *H01L 27/06* | (2006.01) |
| *H01L 29/423* | (2006.01) |
| *H01L 29/66* | (2006.01) |
| *H01L 29/739* | (2006.01) |
| *H01L 29/78* | (2006.01) |

(Continued)

(52) U.S. Cl.
CPC ....... *H01L 27/0629* (2013.01); *H01L 27/0733* (2013.01); *H01L 29/4236* (2013.01); *H01L 29/66333* (2013.01); *H01L 29/66348* (2013.01); *H01L 29/66712* (2013.01); *H01L 29/66734* (2013.01); *H01L 29/7395* (2013.01); *H01L 29/7397* (2013.01); *H01L 29/7803* (2013.01); *H01L 29/7813* (2013.01); *H01L 24/49* (2013.01)

(58) Field of Classification Search
CPC .................................. H01L 92/4236
See application file for complete search history.

(56) References Cited

U.S. PATENT DOCUMENTS

| | | | |
|---|---|---|---|
| 2005/0202577 A1 | 9/2005 | Williams et al. | |
| 2008/0179666 A1* | 7/2008 | Foerster | H01L 29/1095 257/330 |
| 2009/0224302 A1* | 9/2009 | Willmeroth | H01L 27/0733 257/296 |

FOREIGN PATENT DOCUMENTS

| | | |
|---|---|---|
| DE | 100 38 177 A1 | 2/2002 |
| JP | 2004-186634 A | 7/2004 |
| JP | 2007-305747 A | 11/2007 |

OTHER PUBLICATIONS

Extended European Search Report received in corresponding European Application No. 16150741.3 dated Jul. 11, 2016.

* cited by examiner

*Primary Examiner* — Ha Tran T Nguyen
*Assistant Examiner* — Aaron Dehne
(74) *Attorney, Agent, or Firm* — Mattingly & Malur, PC

(57) ABSTRACT

Performance of a semiconductor device is improved without increasing an area size of a semiconductor chip. For example, a source electrode of a power transistor and an upper electrode of a capacitor element have an overlapping portion. In other word, the upper electrode of the capacitor element is formed over the source electrode of the power transistor through a capacitor insulating film. That is, the power transistor and the capacitor element are arranged in a laminated manner in a thickness direction of the semiconductor chip. As a result, it becomes possible to add a capacitor element to be electrically coupled to the power transistor while suppressing an increase in planar size of the semiconductor chip.

15 Claims, 17 Drawing Sheets

(51) Int. Cl.
*H01L 27/07* (2006.01)
*H01L 23/00* (2006.01)

SEMICONDUCTOR DEVICE AND METHOD OF MANUFACTURING THE SAME

CROSS-REFERENCE TO RELATED APPLICATIONS

The disclosure of Japanese Patent Application No. 2015-004147 filed on Jan. 13, 2015 including the specification, drawings and abstract is incorporated herein by reference in its entirety.

BACKGROUND

The present invention relates to a semiconductor device and a technology of manufacturing the same, and particularly relates to a technology effectively applied to a semiconductor device having a power transistor and a technology of manufacturing the same.

Japanese Patent Laid-open No. 2004-186634 (Patent Document 1) discloses a technology of allowing a high-frequency noise component to flow into a capacitor serving as a bypass by coupling the capacitor between a source electrode and a drain electrode of a junction FET (Junction Field Effect Transistor).

[Patent Document 1]
Japanese Patent Laid-open No. 2004-186634

SUMMARY

According to the technology described in Patent Document 1, as shown in FIG. 2 of Patent Document 1, in a plan view, the capacitor is formed in a region different from a region in which the junction FET is formed. For this reason, it is conceivable that there arises a problem of a growing plane size of a semiconductor chip in which the junction FET and the capacitor are formed.

An object of the present invention is to provide a technology of improving performance of a semiconductor device without increasing a size of the semiconductor device.

The above and other purposes and novel features of the present invention will be apparent from the description of the present specification and the accompanying drawings.

A semiconductor device according to one embodiment includes; a power transistor; and a capacitor element electrically coupled between a first electrode and a second electrode of the power transistor. The capacitor element and the power transistor are so arranged as to at least have an overlapping portion in a plan view.

Further, a method of manufacturing a semiconductor device according to one Embodiment includes the steps of: forming a source electrode of the power transistor also serving as a lower electrode of the capacitor element; forming a capacitor insulating film of the capacitor element over the source electrode; and forming an upper electrode of the capacitor element over the capacitor insulating film.

According to one embodiment, performance of the semiconductor device can be improved without increasing an area size of a semiconductor chip.

BRIEF DESCRIPTION OF THE DRAWINGS

FIGS. 1A and 1B are circuit diagrams, in which FIG. 1A shows a circuit symbol indicating an ordinarily employed power transistor and FIG. 1B shows a circuit configuration of a semiconductor device according to First Embodiment;

DETAILED DESCRIPTION

The following embodiments will be described, divided into plural sections or embodiments, if necessary for convenience. Except for the case where it shows clearly in particular, they are not mutually unrelated and one has relationship such as a modification, details, and supplementary explanation of some or entire of another.

In the following embodiments, when referring to the number of elements etc. (including the number, a numeric number, an amount, a range, etc.), they may not be restricted to the specific number but may be greater or smaller than the specific number, except for the case where they are clearly specified in particular and where they are clearly restricted to a number theoretically.

Further, in the following embodiments, it is needless to say that an element (including an element step etc.) is not necessarily indispensable, except for the case where it is clearly specified and where it is considered to be clearly indispensable from a theoretical point of view etc.

Similarly, in the following embodiments, when shape, positional relationship, etc. of an element etc. are referred to, what resembles or is similar to the shape etc. shall be included, except for the case where it is clearly specified in particular and where it is considered to be clearly not right from a theoretical point of view. This statement also applies to the numeric value and range described above.

In all drawings for explaining embodiments, the symbol is attached to the same member, as a principle, and the repeated explanation thereof is omitted. In order to make a drawing intelligible, hatching may be attached even if it is a plan view.

First Embodiment

Circuit Configuration of Semiconductor Device

Figure 1A:
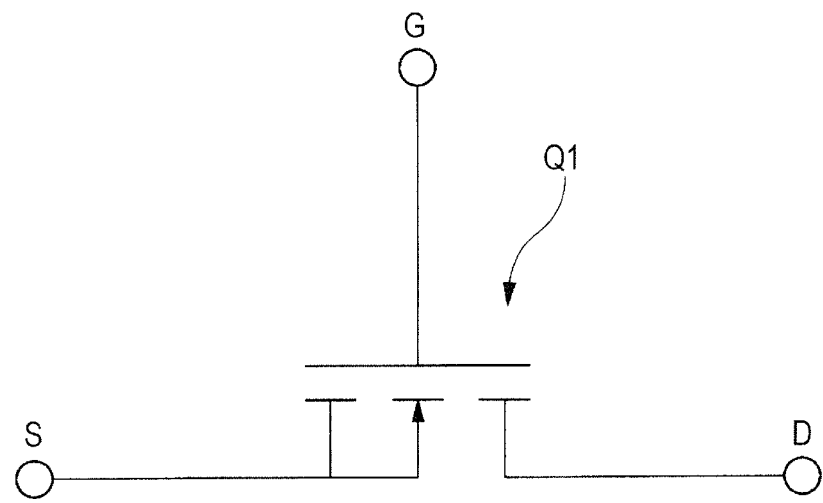

First, a circuit configuration of a semiconductor device according to First Embodiment will be explained. FIG. 1A shows a circuit symbol which indicates an ordinarily employed power transistor (field-effect transistor). In FIG. 1A, a power transistor Q1 has a source S and a drain D spaced from each other, and includes a gate G which controls turning on/off a current flowing between the drain D and the source S. That is, in a state where a potential difference is produced between the source S and the drain D, when a gate voltage equal to or greater than a threshold voltage is applied to the gate G, a channel including an inversion layer is formed in a region immediately below the gate G, and a current flows between the drain D and the source S through this channel. On the other hand, when a gate voltage smaller than a threshold voltage is applied to the gate G, the channel which includes the inversion layer disappears, causing no electric current to flow between the drain D and the source S. Thus, it becomes possible to control turning on/off the current flowing between the drain D and the source S by the gate voltage applied to the gate G.

In the ordinarily used power transistor Q1 configured as above, for example, when a high frequency noise is inputted to the power transistor Q1 from the drain D, there may occur a noise from the power transistor Q1 due to a parasitic resistance which exists in the power transistor Q1. Therefore, in order to improve performance of a semiconductor device, it is necessary to suppress an occurrence of the noise from the power transistor Q1 resulting from the high frequency noise.

Figure 1B:
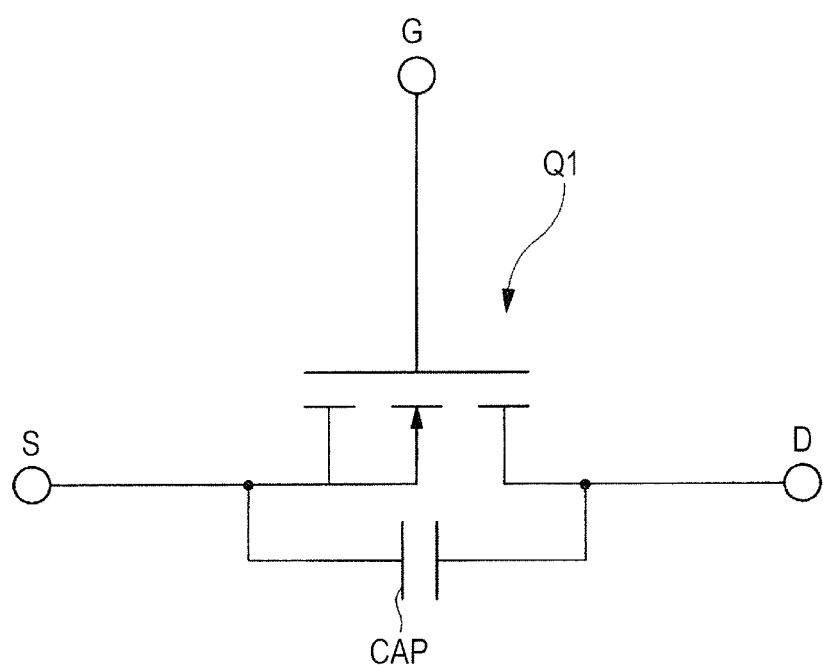

Consequently, in the semiconductor device according to First Embodiment, the circuit configuration shown below is adopted. More specifically, FIG. 1B shows the circuit configuration of the semiconductor device according to First Embodiment. As shown in FIG. 1B, in the semiconductor device according to First Embodiment, a capacitor element CAP is coupled with the power transistor Q1 in parallel. That is, the capacitor element CAP is coupled between the drain D and the source S of the power transistor Q1.

Thus, according to the semiconductor device of First Embodiment, the occurrence of the noise from the power transistor Q1 resulting from the high frequency noise can be suppressed. It is because a high frequency noise inputted from the drain D of the power transistor Q1 does not pass through the power transistor Q1, for example, but passes through the capacitor element CAP and is outputted from the source S. That is, since the impedance of the capacitor element CAP becomes small with respect to the high frequency noise, the high frequency noise flows through the capacitor element CAP whose impedance is small rather than the power transistor Q1 whose impedance is large due to the parasitic resistance. As a result, according to the semiconductor device of First Embodiment, an occurrence of the noise from the power transistor Q1 resulting from the high frequency noise can be suppressed. Furthermore, the circuit configuration according to First Embodiment has an advantage of smoothing the noise, by the capacitor element CAP, due to voltage variation at the time of switching of the power transistor Q1. As a result, according to the circuit configuration shown in FIG. 1B, performance of the semiconductor device including the power transistor Q1 can be improved. Therefore, according to First Embodiment, from the aspect of improving the performance of the semiconductor device including the power transistor Q1, the circuit configuration shown in FIG. 1B is adopted. Hereinafter, the device configuration of the semiconductor device which embodies the circuit configuration shown in FIG. 1B will be explained.

Device Configuration of Semiconductor Device

Figure 2:
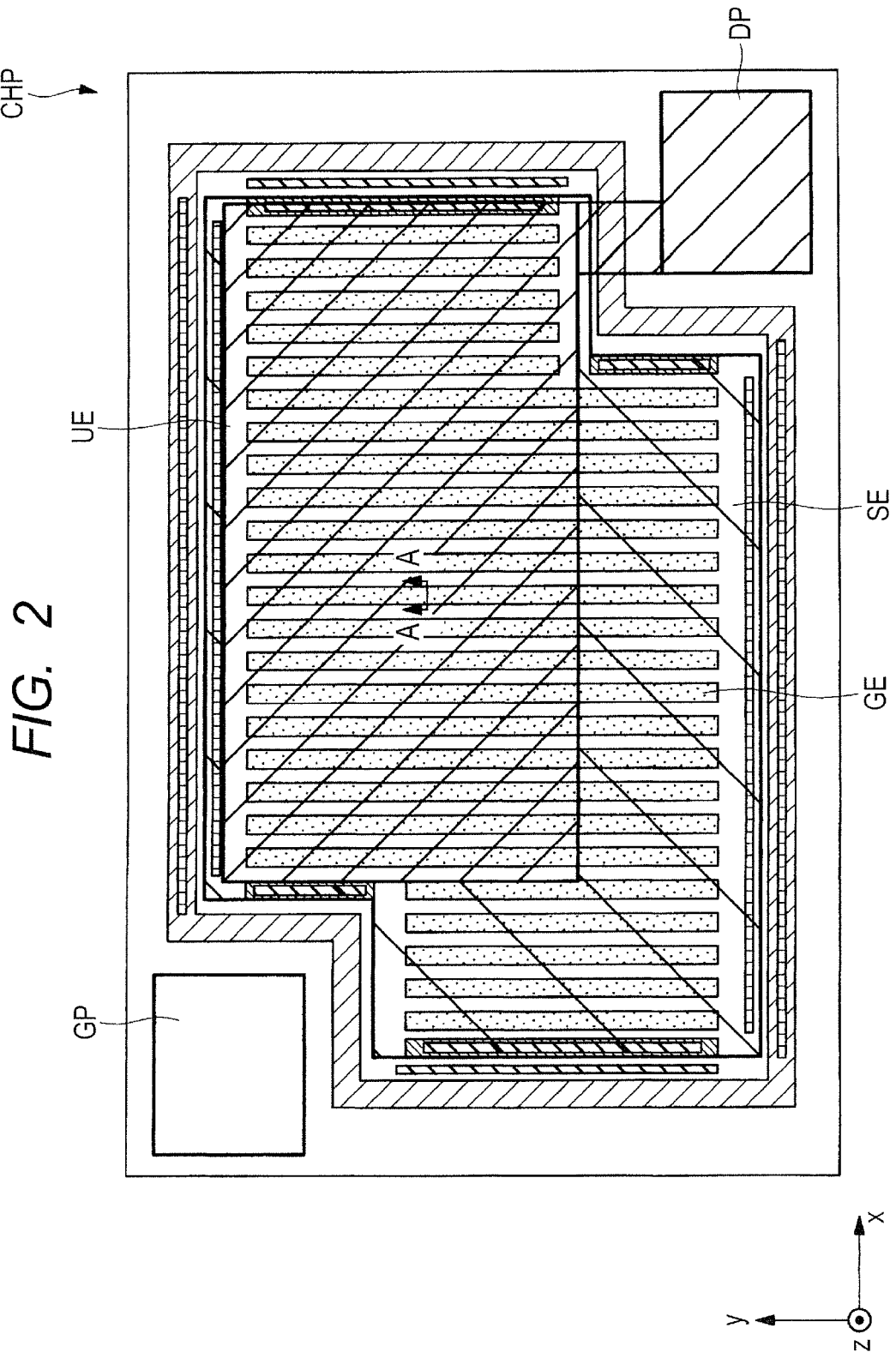
FIG. 2 shows a planar configuration of a semiconductor chip according to First Embodiment.

FIG. 2 shows a planar configuration of the semiconductor chip CHP of First Embodiment. In FIG. 2, the semiconductor chip CHP according to First Embodiment is, for example, rectangular. The power transistor and the capacitor element are formed in an active region formed in the central part. More specifically, as shown in FIG. 2, in the active region, a plurality of gate electrodes GE are formed so as to be in parallel with each other. The gate electrodes GE are so arranged as to extend, for example, in Y-direction, respectively. That is, the gate electrodes GE are contained in a unit transistor, and the power transistor is formed by coupling a plurality of unit transistors in parallel. That is, the power transistor includes the unit transistors.

Also, as shown in FIG. 2, over the gate electrodes GE, a source electrode SE of the power transistor is formed. Further, according to First Embodiment, an upper electrode UE of the capacitor element is so formed as to partially overlap the source electrode SE. Particularly, in FIG. 2, over the entire active region where the gate electrodes GE are formed, the source electrode SE of the power transistor is formed. In a plan view, the upper electrode UE of the capacitor element is so formed as to be contained in the source electrode SE. In other words, a plane area of the source electrode SE of the power transistor has become larger than that of the upper electrode UE of the capacitor element.

At a corner portion away from the active region, as shown in FIG. 2, a drain pad DP is formed. The upper electrode UE of the capacitor element formed in the active region is electrically coupled with the drain pad DP. Further, a gate pad GP is formed at a corner portion diagonally located with respect to the corner portion where the drain pad PD is formed. Though not shown in FIG. 2, the gate pad GP is electrically coupled with a plurality of gate electrodes GE formed in the active region. In this way, a planar configuration of the semiconductor chip CHP according to First Embodiment is made.

Figure 3:
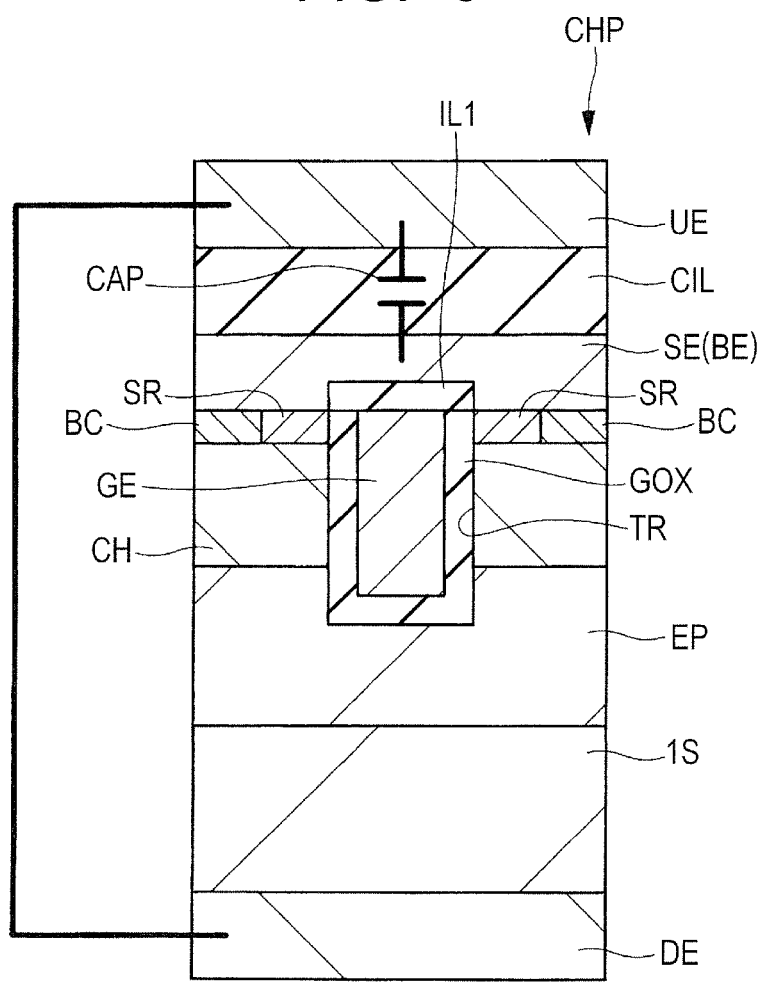
FIG. 3 is a cross-sectional view taken along line A-A of FIG. 2.

FIG. 3 is a cross-sectional view taken along line A-A of FIG. 2. As shown in FIG. 3, in the semiconductor chip CHP of First Embodiment, the power transistor and the capacitor element CAP electrically coupled to the power transistor are laminated in a thickness direction of the semiconductor chip CHP.

Further, the power transistor has a source electrode SE and a drain electrode DE spaced from each other in the thickness direction of the semiconductor chip CHP and a gate electrode GE which controls turning on/off a current flowing between the drain electrode DE and the source electrode SE. On the other hand, the capacitor element CAP includes the source electrode SE serving as a lower electrode, a capacitor insulating film CIL formed over the source electrode SE, and an upper electrode UE formed over the capacitor insulating film CIL and electrically coupled with the drain electrode DE.

More specifically, in the semiconductor chip CHP of First Embodiment, for example, a drift layer EP (epitaxial layer) is formed over a semiconductor substrate 1S which includes silicon containing n type impurities such as phosphorus (P) and arsenic (As). The drift layer EP includes, for example, a semiconductor layer mainly containing silicon into which n type impurities, such as phosphorus (P) and arsenic (As), are introduced. In this way, the drain region of the power transistor includes the semiconductor substrate 1S and the drift layer EP.

Over a surface of the drift layer EP, a channel region CH is formed. Further, a trench TR passing through the channel layer CH and reaching the drift layer EP is formed. At this time, the channel region CH includes, for example, a semiconductor region into which p type impurities, such as boron (B), are introduced. Then, over an inner wall of the trench TR, a gate insulating film GOX is formed. Further, the gate electrode GE is so formed as to fill the trench TR through the gate insulating film GOX. The gate insulating film GOX includes, for example, a silicon oxide film, which is not limitative. For example, the gate insulating film GOX may include a high dielectric-constant film having a higher dielectric constant than that of the silicon oxide film. Moreover, the gate electrode GE includes, for example, a polysilicon film. Furthermore, a source region SR is formed over a surface of the channel layer CH in contact with the trench TR, and the source region SR includes, for example, a semiconductor region into which n type impurities, such as phosphorus (P) and arsenic (As), are introduced. Moreover, so as to cover an upper surface of the gate electrode GE, for example, an insulating film IL1 including a silicon oxide film is formed.

Over the surface of the channel layer CH adjacent to the source region SR, a body contact region BC is formed. The body contact region BC includes, for example, a semiconductor region into which p type impurities, such as boron (B), are introduced. The impurity concentration of the body contact region BC is higher than that of the channel region CH.

Then, as shown in FIG. 3, over the source region SR and the body contact region BC, the source electrode SE including, for example, an aluminum film is so formed as to be in contact with the source region SR and the body contact region BC. Accordingly, the source region SR and the body contact region BC are electrically coupled through the source electrode SE. At this time, the body contact region BC has a function of securing the ohmic contact with the source electrode SE. Because of the existence of the body contact region BC, the source region SR and the channel region CH are electrically coupled at the same voltage potential. Therefore, it becomes possible to control an on/off operation of a parasitic npn bipolar transistor using the source region SR as an emitter region, a channel layer CH as a base region, and a drift layer EP as a collector region. As described above, the source region SR and the channel layer CH are electrically coupled at the same voltage potential. This means there is no difference in potential between the emitter region and the base region of the parasitic npn bipolar transistor, thereby enabling the control of the on/off operation of the parasitic npn bipolar transistor.

In this regard, the source electrode SE is formed ranging from over the source region SR, the body contact region BC, and to over the gate electrode GE, and an insulating film IL1 is interposed between the source electrode SE and the gate electrode GE. Thus, the source electrode SE and the gate electrode GE are electrically insulated by the insulating film IL1.

On the other hand, a drain electrode DE is formed over the back surface of the semiconductor substrate 1S. Accordingly, the drain region of the power transistor including the semiconductor substrate 1S and the drift layer EP becomes electrically coupled with the drain electrode DE. In this way, the power transistor is formed in the semiconductor chip CHP according to First Embodiment. Further, in the semiconductor chip CHP according to First Embodiment, the capacitor element CAP is laminated over the power transistor in the thickness direction of the semiconductor chip CHP.

More specifically, as shown in FIG. 3, the capacitor insulating film CIL is formed over the source electrode SE of the power transistor, and the upper electrode UE is formed over the capacitor insulating film CIL. The film thickness of the capacitor insulating film CIL is, for example, 50 nm or more and 250 nm or less.

As a result, in the semiconductor chip CHP of First Embodiment, there are formed: the capacitor insulating film CIL using the source electrode SE as a lower electrode and being over the lower electrode; and the capacitor element CAP including an upper electrode UE over the capacitor insulating film CIL. That is, in the semiconductor chip CHP according to First Embodiment, there is formed in an upper portion of the power transistor the capacitor element CAP using the source electrode SE as the lower electrode. That is, in the semiconductor chip CHP of First Embodiment, while adopting the configuration allowing the source electrode SE of the power transistor to also serve as the lower electrode of the capacitor element CAP, the power transistor and the capacitor element CAP are arranged in a laminated manner in the thickness direction of the semiconductor chip CHP.

Since the upper electrode UE of the capacitor element CAP and the drain electrode DE of the power transistor are electrically coupled, it is seen that, in the semiconductor chip CHP of First Embodiment, the device configuration (the power transistor Q1 and the capacitor element CAP) where the circuit configuration of FIG. 1B is embodied is formed.

Package Configuration of Semiconductor Device

Figure 4:
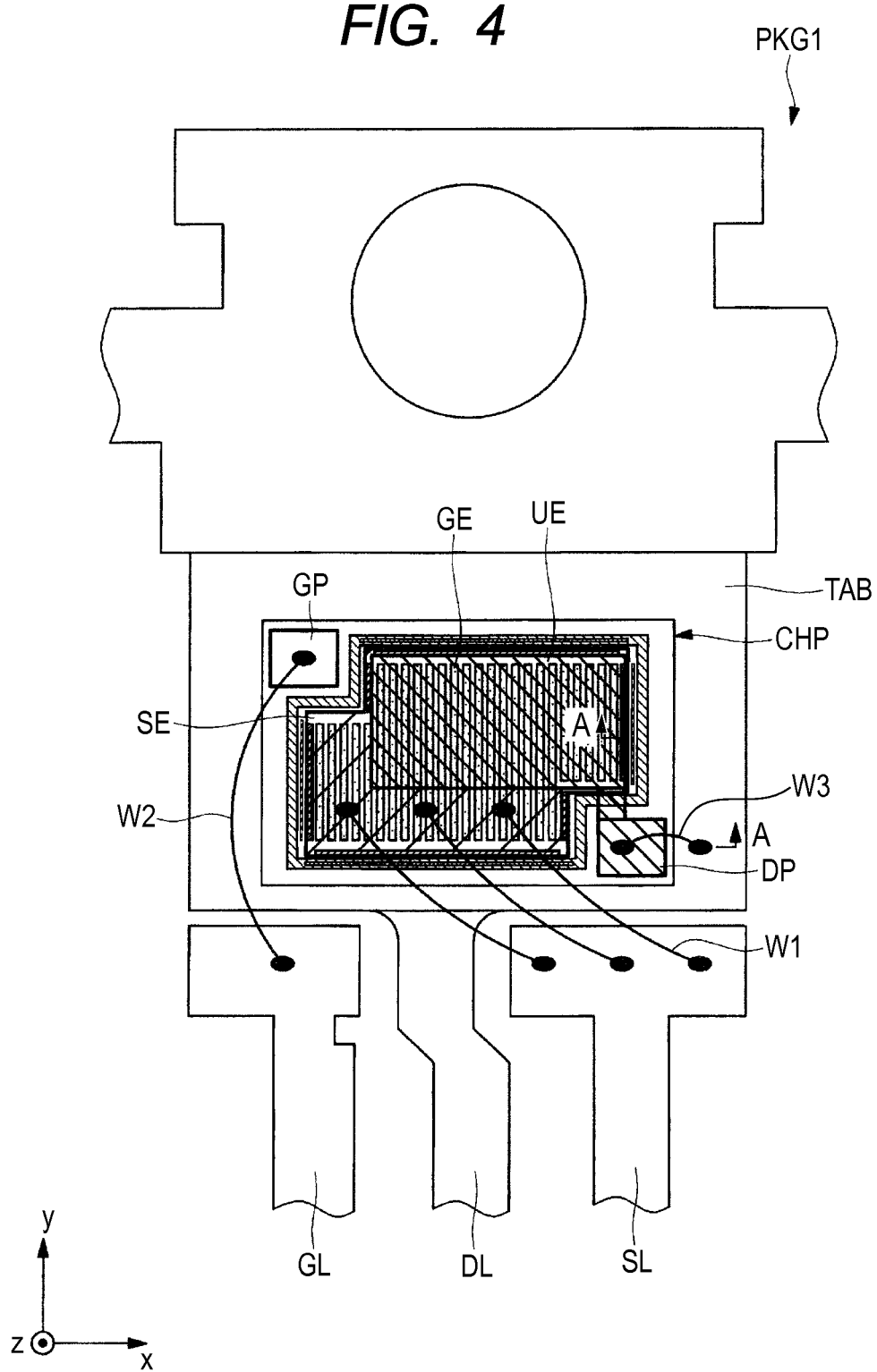
FIG. 4 is a plan view showing a package configuration of the semiconductor device according to First Embodiment.

Next, a package configuration of the semiconductor device of First Embodiment will be explained. FIG. 4 is a plan view showing the package configuration of a semiconductor device PKG1 according to First Embodiment.

According to FIG. 4, the semiconductor device PKG1 of First Embodiment has a chip mounting part TAB and, over the chip mounting part TAB, the semiconductor chip CHP having the configuration explained with reference to FIGS. 2 and 3 is mounted. At this time, the semiconductor chip CHP is mounted over the chip mounting part TAB so that the drain electrode formed over the back surface of the semiconductor chip CHP may come in contact with the chip mounting part TAB. In this regard, while the drain electrode is formed over the back surface of the semiconductor chip CHP, the gate pad GP, the source electrode SE, and the upper electrode UE which are electrically coupled with a plurality of gate electrodes are formed over the main surface of the semiconductor chip CHP. Thus, in the semiconductor device PKG1 according to First Embodiment, in a plan view, over the surface of the semiconductor chip CHP, an upper electrode exposure region where the upper electrode UE is exposed and a source electrode exposure region where the source electrode SE is exposed are formed and, also, the gate pad GP is exposed.

Next, as shown in FIG. 4, a drain lead DL is joined to the chip mounting part TAB. The semiconductor device PKG1 in First Embodiment has a gate lead GL and a source lead SL spaced from the chip mounting part TAB and are so arranged as to sandwich the drain lead DL being spaced from the drain lead DL.

The source electrode exposure region (source electrode SE) and the source lead SL are coupled, for example, using a wire W1 including a gold wire. The gate pad GP and the gate lead GL are coupled, for example, using a wire W2 including a gold wire. On the other hand, a drain pad DP electrically coupled with the upper electrode UE is exposed over the surface of the semiconductor chip CHP. The drain pad DP and the chip mounting part TAB are coupled, for example, using a wire W3 including a gold wire.

Figure 5:
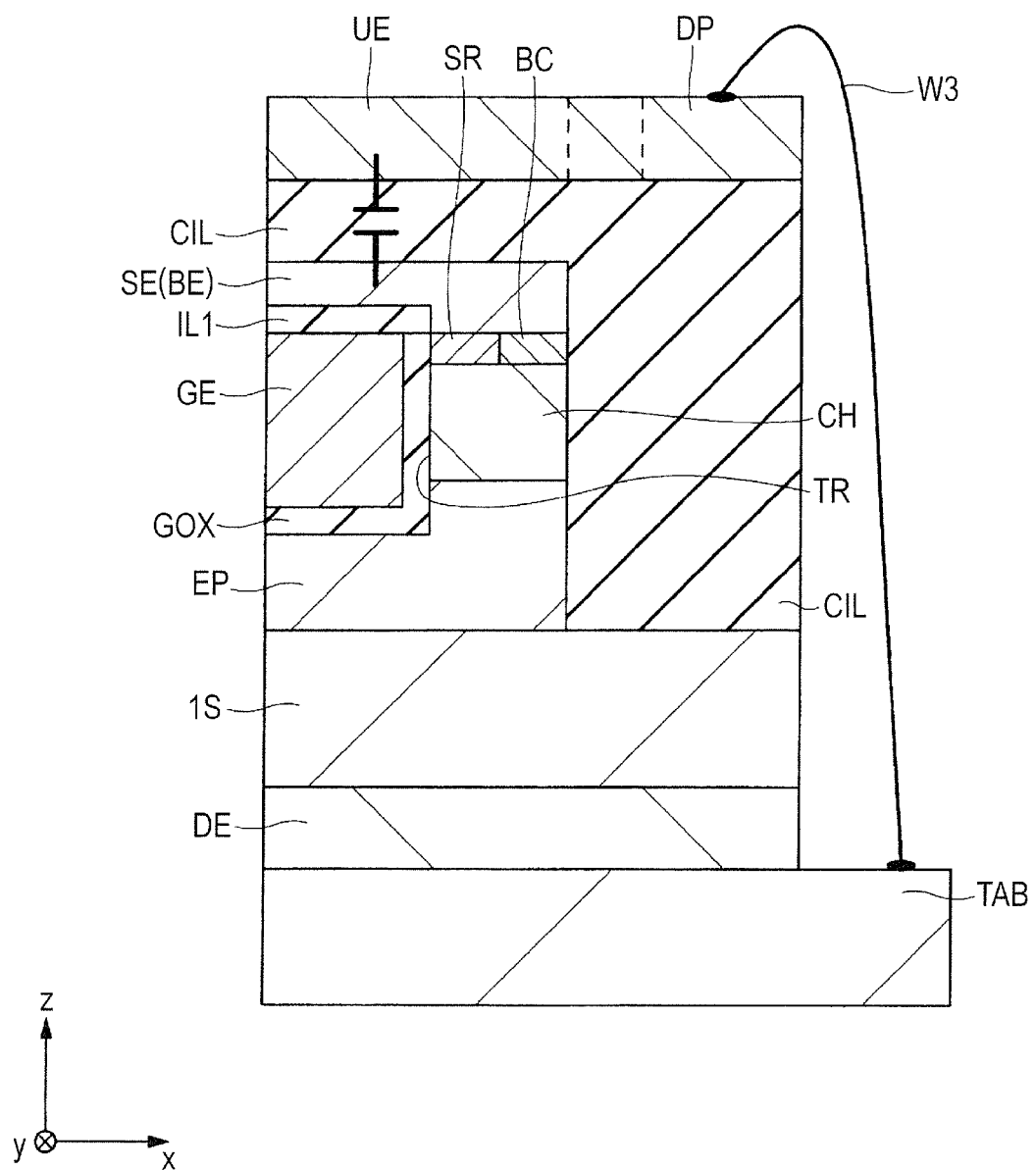
FIG. 5 is a cross-sectional view taken along line A-A of FIG. 4.

More specifically, FIG. 5 is a cross-sectional view taken along line A-A of FIG. 4. As shown in FIG. 5, outside the region (active region) in which the power transistor is formed, the capacitor insulating film CIL is formed over the semiconductor substrate 1S. The upper electrode UE of the capacitor element formed above the power transistor is coupled with the drain pad DP arranged over the capacitor insulating film CIL outside the active region by, for example, the wiring formed in the upper portion of the capacitor insulating film CIL. It is seen that the drain pad DP is coupled with the upper surface the chip mounting part TAB through the wire W3. Therefore, the upper electrode UE of the capacitor element is electrically coupled with the chip mounting part TAB through the drain pad DP and the wire W3. Furthermore, when considering that the chip mounting part TAB is in contact with the drain electrode DE, it is seen that the upper electrode UE of the capacitor element is electrically coupled with the drain electrode DE formed over the back surface of the semiconductor chip. Thus, the packaging of the semiconductor device PKG1 is carried out.

Distinctive Features of First Embodiment

Now, distinctive features of First Embodiment will be explained. A first feature of First Embodiment is that, for example, as shown in FIG. 2, the source electrode SE of the power transistor and the upper electrode UE of the capacitor element CAP have an overlapping portion. In other words, the first distinctive feature of First Embodiment is that, for example, as shown in FIG. 3, the upper electrode UE of the capacitor element CAP is formed over the source electrode SE of the power transistor through the capacitor insulating film CIL. That is, according to the first distinctive feature of First Embodiment, the power transistor and the capacitor element CAP are arranged in a laminated manner in the thickness direction of the semiconductor chip CHP.

Thus, according to First Embodiment, while suppressing an increase in planar size of the semiconductor chip CHP, a capacitor element CAP to be electrically coupled with the power transistor can be added. For example, when arranging the capacitor element to be side by side with the power transistor in a plane, a planar size of the semiconductor chip increases. Particularly, in terms of allowing a high frequency noise to easily enter a bypass route of the capacitor element, it is desirable to make the capacitance of the capacitor element as great as possible and to make the impedance to the high frequency noise small. That is, in order to suppress an occurrence of the noise from the power transistor resulting from the high frequency noise, it is desirable to make the capacitance of the capacitor element coupled with the power transistor in parallel greater.

However, for example, the capacitance of the capacitor element is in proportion to a facing area of the electrodes. Consequently, in order to increase the capacitance of the capacitor element, it is necessary to increase the plane size of the capacitor element. Therefore, provided that the capacitor element is disposed side by side with the power transistor in a plan view, when increasing the capacitance of the capacitor element, the planar size of the semiconductor chip increases considerably. In such a case, it becomes difficult to miniaturize the semiconductor chip. Furthermore, as the plane size of the semiconductor chip becomes larger, the size of the package (semiconductor device) where the semiconductor chip is mounted and sealed also becomes larger. Moreover, it is necessary to design and develop a new package for mounting and sealing the semiconductor package having a larger plane size, causing a rise in the manufacturing cost of the semiconductor device.

On the other hand, according to First Embodiment, for example, as shown in FIG. 3, the power transistor and the capacitor element CAP are arranged in a laminated manner in the thickness direction of the semiconductor chip CHP. As a result, according to First Embodiment, it becomes possible to suppress an increase in planar size of the semiconductor chip CHP while adding the capacitor element CAP to be electrically coupled with the power transistor. The above is achieved by the source electrode SE of the power transistor and the upper electrode UE of the capacitor element CAP being arranged in an overlapped manner. In this way, a sum of the plane sizes of the power transistor and the capacitor element CAP is sharply reduced compared with the plane size in the case of arranging the capacitor element side by side with the power transistor in a plan view. In particular, as shown in FIG. 2, in a plan view, by arranging the upper electrode UE of the capacitor element CAP so as to be contained in the source electrode SE of the power transistor, it becomes possible to allow the sum of the plane sizes of the power transistor and the capacitor element CAP to be substantially equivalent to the plane size of a single power transistor.

Further, as shown by First Embodiment, in the configuration where the source electrode SE of the power transistor and the upper electrode UE of the capacitor element CAP are arranged in an overlapped manner, it becomes easier to increase the capacitance of the capacitor element CAP while suppressing the increase of sum of the plane sizes of the power transistor and the capacitor element CAP. Suppose that an area of the source electrode SE of the power transistor is "S1" and an area of the upper electrode UE of the capacitor element CAP is "S2 (<S1)", according to the first distinctive feature of First Embodiment, it becomes possible to allow the planar size (facing area of the electrodes) of the capacitor element CAP to be "S2" while keeping the sum of the planar sizes of the power transistor and the capacitor element CAP to be "S1". On the other hand, when disposing the capacitor element so as to be side by side with the power transistor in a plan view, in order to allow the plane size (facing area of the electrodes) of the capacitor element CAP to be "S2", it is necessary to make the sum of the planar sizes of the power transistor and the capacitor element "S1+S2". Thus, according to the first distinctive feature of First Embodiment, it is seen that it is possible to effectively suppress the increase of the sum of the plane sizes of the power transistor and the capacitor element CAP while increasing the capacitance of the capacitor element CAP.

Therefore, according to the first distinctive feature of First Embodiment, it is seen that it is possible to miniaturize the semiconductor chip while adding the capacitor element CAP. As a result, according to the first distinctive feature of First Embodiment, it becomes also possible to suppress the increase in size of the package (semiconductor device) where the semiconductor chip is mounted and sealed. This means that, as a package for mounting and sealing the semiconductor chip CHP to which the capacitor element CAP is added, it becomes easier to reuse the package which has been used before adding the capacitor element CAP. As a result, according to the first distinctive feature of First Embodiment, it becomes unnecessary to design and develop a new package conforming to the semiconductor chip CHP to which the capacitor element CAP is added. Consequently, it becomes possible to suppress the rise in manufacturing cost of the semiconductor device.

A second distinctive feature of First Embodiment is that, for example, as shown in FIG. 3, the source electrode SE of the power transistor and the lower electrode BE of the capacitor element CAP are the same component. In other words, the second distinctive feature of First Embodiment is that one component is double used both as the source electrode SE of the power transistor and the lower electrode BE of the capacitor element CAP, and the source electrode SE as it is of the power transistor serves also as the lower electrode BE of the capacitor element CAP.

In this way, compared with the case where different components are used for the source electrode of the power transistor and the lower electrode of the capacitor element, the configuration of the semiconductor device can be simplified. In particular, as an example where different components are used for the source electrode of the power transistor and the lower electrode of the capacitor element, a case is conceivable where the lower electrode is formed over the source electrode through an insulating film, and the source electrode and the lower electrode are electrically coupled by a plug which passes through the insulating film. However, in such a case, the configuration of coupling the source electrode and the lower electrode becomes complicated. Furthermore, since the source electrode and the lower electrode are electrically coupled with use of the plug which passes through the insulating film, an increase in parasitic resistance is likely to happen.

In this regard, by a high frequency noise flowing in the parasitic resistance which exists in the power transistor, for the purpose of suppressing an occurrence of the noise from the power transistor, there is provided a capacitor element which serves as a bypass route for the high frequency noise.

However, the occurrence of the parasitic resistance between the source electrode and the lower electrode means that the parasitic resistance in the bypass route of the high frequency noise increases. As a result, even if the high frequency noise flows through the bypass route, due to the parasitic resistance existing in the bypass route, a new noise is generated. Furthermore, the occurrence of the parasitic resistance in the bypass route means an increase in impedance of the bypass route, which also makes the high frequency noise difficult to flow through the bypass route. That is, the occurrence of the noise from the power transistor is suppressed by the high frequency noise flowing through the parasitic resistance existing in the power transistor. In order to achieve the above, even when the capacitor element serving as the bypass route for the high frequency noise is provided to suppress the noise from the power transistor, if the impedance of the bypass route increases due to a parasitic resistance newly produced in the bypass route, the high frequency noise becomes less likely to flow into the bypass route. Furthermore, even if the high frequency noise flows into the bypass route, an occurrence of a new noise may be caused by a new parasitic resistance existing in the bypass route. Therefore, according to the configuration example described above, it becomes difficult to fully exhibit a technical significance that, for the purpose of suppressing the noise from the power transistor caused by the high frequency noise flowing through the parasitic resistance existing in the power transistor, the capacitor element which serves as the bypass route for the high frequency noise is provided.

On the other hand, according to the second distinctive feature of First Embodiment, unlike the configuration example described above, one component serves as both the source electrode SE of the power transistor and the lower electrode BE of the capacitor element CAP. That is, the source electrode SE of the power transistor also serves as the lower electrode BE of the capacitor element CAP. Therefore, according to the second distinctive feature of First Embodiment, since the source electrode SE and the lower electrode BE are provided as a single unit, the parasitic resistance between the source electrode SE and the lower electrode BE can be reduced. Therefore, according to the second distinctive feature of First Embodiment, it is possible to suppress an increase in impedance in the bypass route resulting from the parasitic resistance between the source electrode SE and the lower electrode BE. Consequently, according to the second distinctive feature of First Embodiment, there can be fully exhibited the technical significance that, in order to suppress the noise from the power transistor caused by the high frequency noise flowing in the parasitic resistance existing in the power transistor, the capacitor element which serves as the bypass route for the high frequency noise is provided.

Further, according to the second distinctive feature of First Embodiment, since one component serves as both the source electrode SE of the power transistor and the lower electrode BE of the capacitor element CAP, as compared with the case where the source electrode and the lower electrode includes different components, respectively, an increase in thickness of the semiconductor chip CHP can be suppressed.

Next, a third distinctive feature of First Embodiment is as follows. That is, for example, as shown in FIG. 2, the drain pad DP is arranged outside the active region in which the power transistor and the capacitor element are formed. Further, the drain pad DP and the upper electrode UE formed in the same layer are electrically coupled. Further, the third distinctive feature of First Embodiment is, for example, as shown in FIG. 5, that the drain pad DP and the chip mounting part TAB are coupled using the wire W3. Consequently, for example, as shown in FIG. 5, the upper electrode UE of the capacitor element is electrically coupled with the drain electrode DE through the drain pad DP, the wire W3, and the chip mounting part TAB, in this order.

At this time, according to the third distinctive feature of First Embodiment, for example, as shown in FIG. 5, the wire W3 is coupled to the drain pad DP arranged outside the active region in which the power transistor and the capacitor element are formed. As a result, during a bonding process in which the wire 3 is coupled to the drain pad DP, it becomes possible to suppress the impact being added to the power transistor and the capacitor element, improving reliability of a semiconductor device. That is, according to the third distinctive feature of First Embodiment, as shown in FIG. 5, the drain pad DP is formed over the capacitor insulating film CIL thickly formed over the semiconductor substrate 1S, and the power transistor and the capacitor element are not formed in a lower layer of the drain pad DP. As a result, according to the third distinctive feature of First Embodiment, the wire W3 can be coupled to the drain pad DP without causing damage to the power transistor and the capacitor element which are formed in the active region. Thus, according to the third distinctive feature of First Embodiment, the upper electrode UE of the capacitor element and the drain electrode DE of the power transistor can be electrically coupled without degrading reliability of the semiconductor device.

Thus, the semiconductor device of First Embodiment can achieve, by including the first, second, and third distinctive features described above, the circuit configuration (see FIG. 1B) in which the capacitor element CAP is coupled between the drain electrode DE and the source electrode SE of the power transistor while the power transistor and the capacitor element CAP are arranged in a laminated manner in the thickness direction of the semiconductor chip CHP. Furthermore, according to the semiconductor device of First Embodiment, even if a capacitor element is added, performance of the semiconductor device can be improved without sacrificing the miniaturization of the semiconductor device. In other words, according to First Embodiment, it is possible to achieve an excellent effect of providing a low-noise semiconductor device while suppressing an increase in its planar size.

Manufacturing Method of Semiconductor Device

The semiconductor device of First Embodiment is configured as described above. Hereinafter, the manufacturing method thereof will be explained with reference to the drawings.

Figure 6:
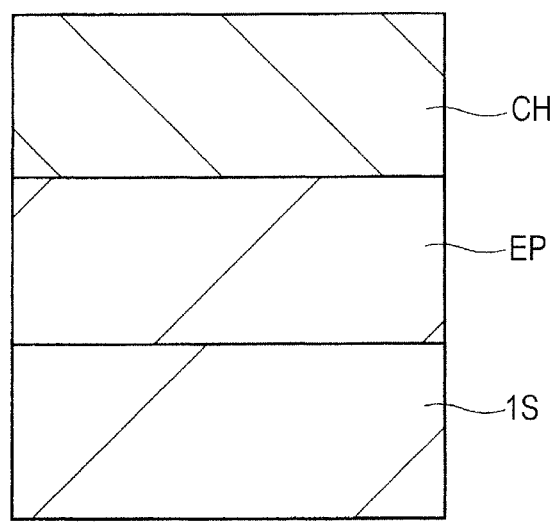
FIG. 6 is a cross-sectional view showing a process of manufacturing the semiconductor device according to First Embodiment.

First, as shown in FIG. 6, for example, a semiconductor substrate 1S is provided which contains silicon as a main component and includes: a drift layer EP; and a channel layer CH formed over the drift layer EP on the main surface side. At this time, the drift layer EP includes an n type semiconductor layer into which n type impurities such as phosphorus (P) and arsenic (As) are introduced. Moreover, the channel layer CH includes a p type semiconductor layer into which, for example, p type impurities such as boron (B) are introduced. In addition, the semiconductor substrate 1S includes at least a power semiconductor element formation region in which a trench gate-type power MOSFET is formed. However, other than the power semiconductor element formation region, for example, the semiconductor substrate 1S may include a region in which a temperature-sensing diode etc. are formed. Hereinafter, in particular, focusing on the power semiconductor element formation region where the trench gate-type power MOSFET is formed, the manufacturing method of the semiconductor device according to First Embodiment will be explained.

In the present specification, a "main component" means a material component of the constituent materials included most in a member (a substrate, a layer, or a film). By the expression, for example, "a semiconductor substrate 1S including silicon as a main component," it is intended that the material of the semiconductor substrate 1S contains silicon (Si) most. In the present specification, by the term, a "main component", it is intended that, for example, the semiconductor substrate 1S includes silicon in general but a member should not be construed as excluding the inclusion of impurities therein.

Moreover, in FIG. 6, the semiconductor substrate 1S, the drift layer EP, and the channel layer CH are shown separately. However, in the present specification, the semiconductor substrate 1S in which the drift layer EP and the channel layer CH are formed is sometimes called a "semiconductor substrate" as one piece. That is, when using a term "semiconductor substrate" in the present specification, there are a case where both a base material for forming the drift layer EP and the channel layer CH are indicated and a case where the base material as a whole in which the drift layer EP is formed is meant.

Figure 7:
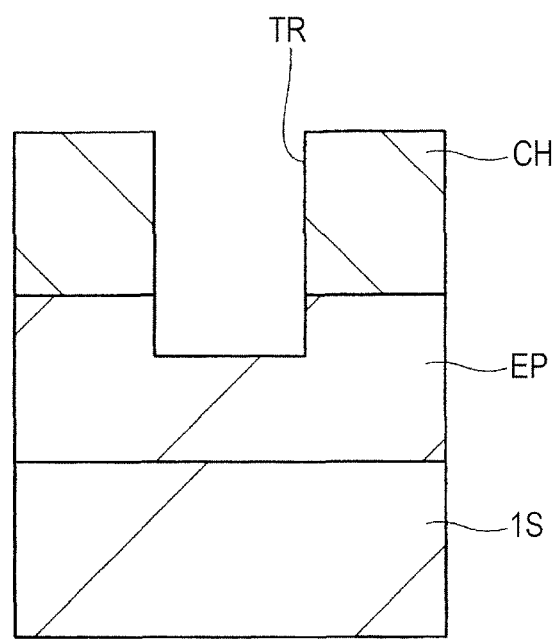
FIG. 7 is a cross-sectional view showing a process of manufacturing the semiconductor device subsequent to FIG. 6.
Figure 8:
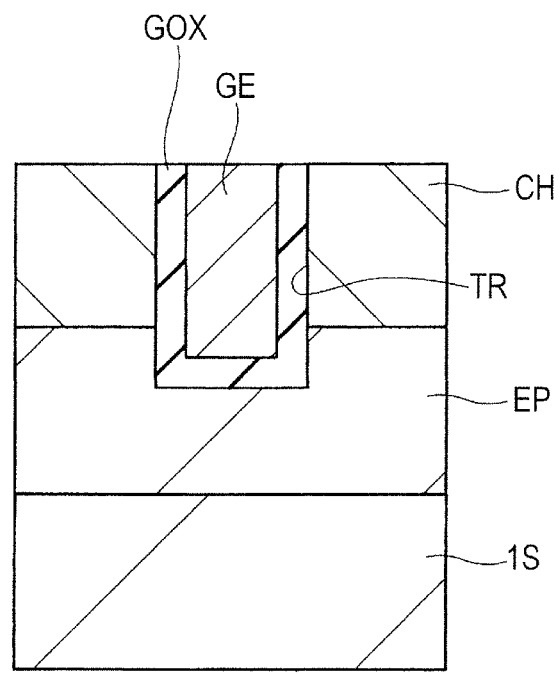
FIG. 8 is a cross-sectional view showing a process of manufacturing the semiconductor device subsequent to FIG. 7.

Next, as shown in FIG. 7, using a photolithography technique and an etching technique, a trench TR which passes through the channel layer CH and reaches the drift layer EP is formed. Then, as shown in FIG. 8, a gate insulating film GOX is formed over an inner wall of each trench TR. The gate insulating film GOX includes, for example, a silicon oxide film and can be formed, for example, using a thermal-oxidation method or a CVD (Chemical Vapor Deposition) method. However, the gate insulating film GOX is not limited to the silicon oxide film. For example, it may include a high-dielectric constant film whose dielectric constant is higher than that of the silicon oxide film. As the high dielectric-constant film, for example, a hafnium oxide film etc. may be used. Subsequently, through the gate insulating film GOX, the gate electrode GE is so formed as to fill the inside of the trench TR. The gate electrode GE includes, for example, a polysilicon film and can be formed, for example, by using the CVD method.

Figure 9:
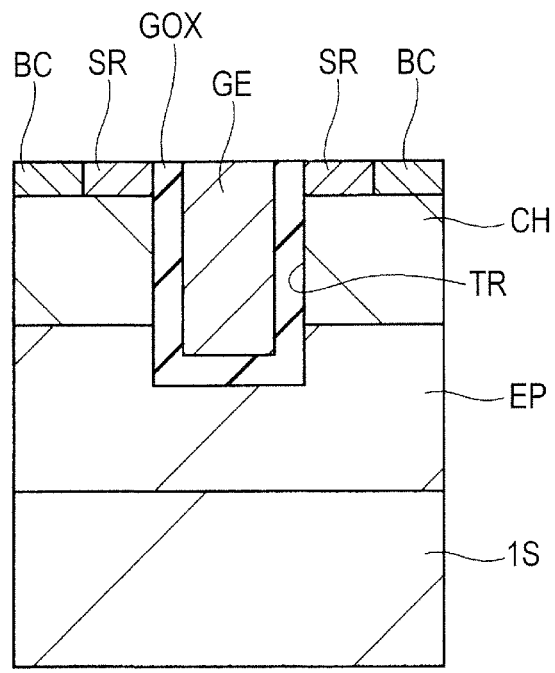
FIG. 9 is a cross-sectional view showing a process of manufacturing the semiconductor device subsequent to FIG. 8.

Then, as shown in FIG. 9, over a surface of the channel layer CH, for example, with use of ion implantation, a source region SR being in contact with the trench TR is formed by introducing n type impurities, such as phosphorus (P) and arsenic (As).

Next, after applying a resist film on the main surface side of the semiconductor substrate 1S, by performing an exposure and development process, the resist film is patterned. The resist film is patterned such that an opening for allowing only a region where the body contact region BC is formed to be open is formed. Then, by ion implantation using the patterned resist film as a mask, for example, p type impurities such as boron (B) are introduced into part of the source region SR exposed through the opening. As a result, as shown in FIG. 9, the body contact region BC including the p type semiconductor region can be formed.

Figure 10:
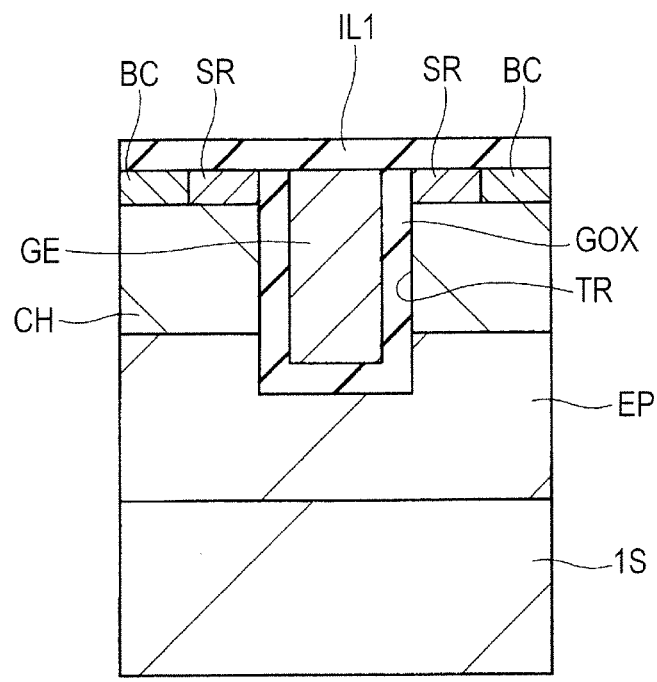
FIG. 10 is a cross-sectional view showing a process of manufacturing the semiconductor device subsequent to FIG. 9.
Figure 11:
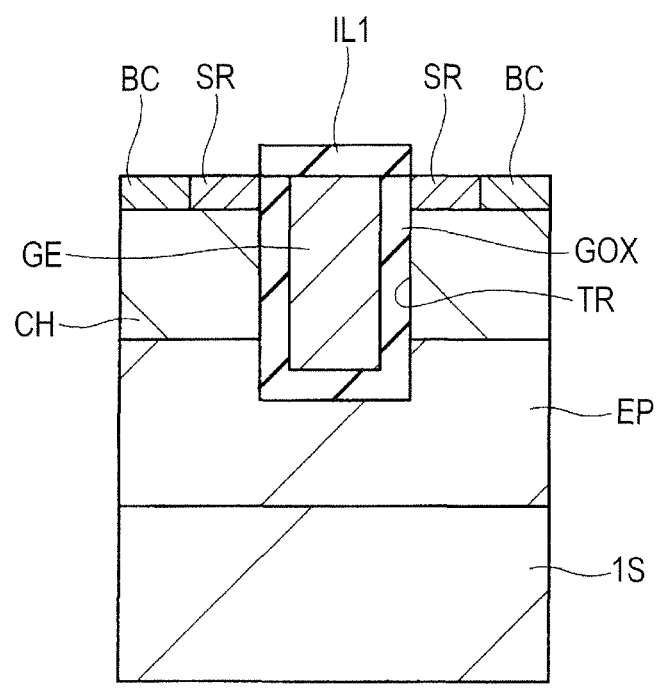
FIG. 11 is a cross-sectional view showing a process of manufacturing the semiconductor device subsequent to FIG. 10.

Next, after removing the patterned resist film, as shown in FIG. 10, an insulating film IL1 is formed on the main surface side of the semiconductor substrate 1S in which the trench TR is formed. The insulating film IL1 includes, for example, a silicon oxide film and, for example, can be formed using the CVD method. Then, as shown in FIG. 11, the insulating film IL1 is patterned by using the photolithography technique and the etching technique. The insulating film IL1 is so patterned as to cover an upper portion of the trench TR in which the gate electrode GE is embedded and as to expose the source region SR and the body contact region BC.

Figure 12:
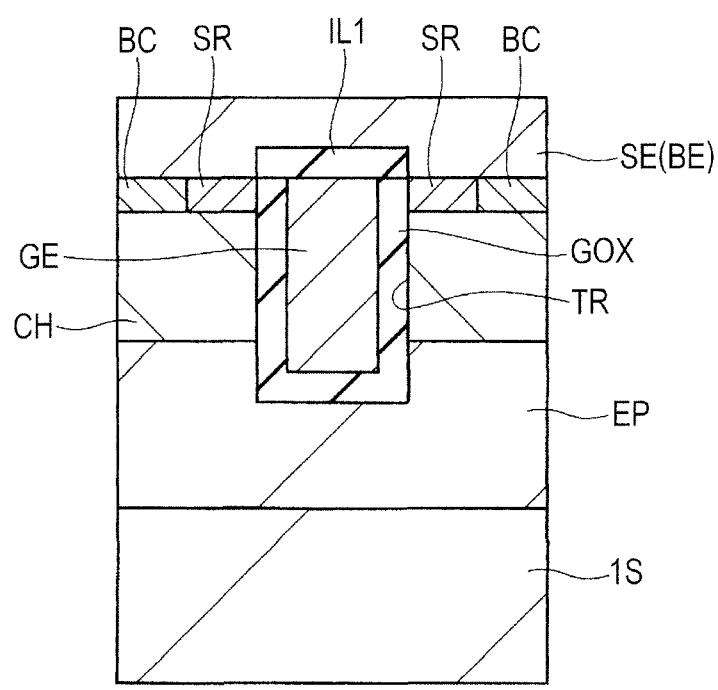
FIG. 12 is a cross-sectional view showing a process of manufacturing the semiconductor device subsequent to FIG. 11.
Figure 12:
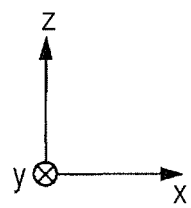

Then, as shown in FIG. 12, an aluminum film is formed over the insulating film IL1 including over the exposed source region SR and over the exposed body contact region BC. The aluminum film can be formed, for example, by using a sputtering method. Then, by patterning the aluminum film using the photolithography technique and the etching technique, the source electrode SE is formed.

Figure 13:
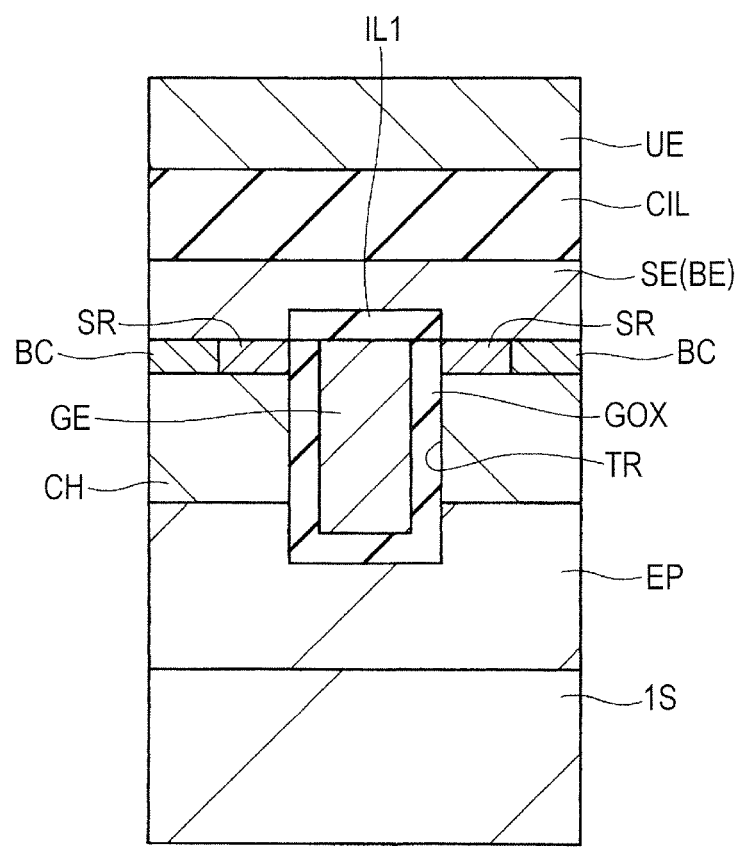
FIG. 13 is a cross-sectional view showing a process of manufacturing the semiconductor device subsequent to FIG. 12.

Next, as shown in FIG. 13, the capacitor insulating film CIL is formed over the source electrode SE and an aluminum film is formed over the capacitor insulating film CIL. At this time, the capacitor insulating film CIL includes, for example, a silicon oxide film, a silicon nitride film, or a laminated film thereof and can be formed, for example, by using the CVD method. Moreover, the aluminum film can be formed, for example, by using the sputtering method.

Then, by using the photolithography technique and the etching technique, the upper electrode UE is formed by patterning the aluminum film. Subsequently, the exposed capacitor insulating film CIL is removed. Thus, it becomes possible to form the capacitor element in which the source electrode SE is used as the lower electrode and which includes the capacitor insulating film CIL and the upper electrode UE. Subsequently, as shown in FIG. 3, the drain electrode DE is formed over the back surface of the semiconductor substrate 1S.

Thus, the semiconductor device of First Embodiment which has a laminated configuration of the power transistor and the capacitor element as described above can be manufactured.

In First Embodiment, the explanation has been given to the case where the source electrode SE and the upper electrode UE include the aluminum film, which is not limitative. For example, the source electrode SE and the upper electrode UE may include an aluminum alloy film represented by an AlSi film and an AlSiCu film, a tungsten film, or a tungsten alloy film.

In First Embodiment, the case has been explained where the upper electrode UE is formed by patterning the aluminum film, which is not limitative. For example, the upper electrode UE can also be formed by, for example, using a re-wiring technique. That is, the upper electrode UE including a copper film can also be formed by forming an opening in a polyimide film and forming the copper film inside the opening with use of a plating method. In this case, since the etching technique is not used when forming the upper electrode UE, the etching damage to the upper electrode UE can be suppressed. As a result, according to the re-wiring technique, an advantage of being able to form a highly reliable upper electrode UE can be obtained.

Modification 1

Figure 14:
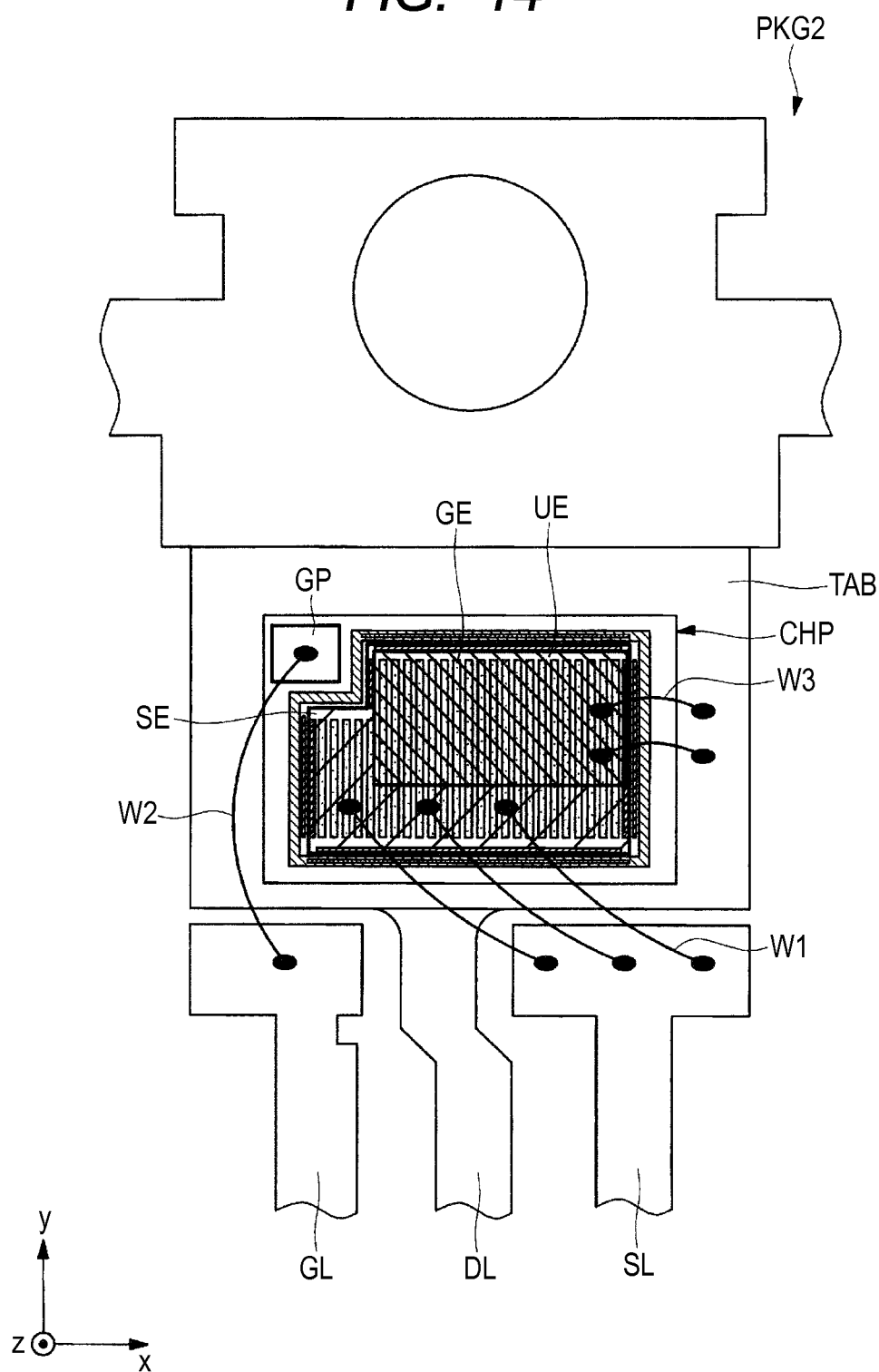
FIG. 14 is a plan view showing a package configuration of a semiconductor device according to Modification 1.

Next, a package configuration of a semiconductor device PKG2 according to Modification 1 will be explained. FIG. 14 is a plan view showing the package configuration of the semiconductor device PKG2 of Modification 1. In FIG. 14, according to Modification 1, the upper electrode UE (upper electrode exposure region) is directly coupled with the chip mounting part TAB using the wire W3. As a result, according to Modification 1, the planar size of the semiconductor chip CHP can be reduced as much as the omitted drain pad over the semiconductor chip CHP. That is, according to the package configuration of the semiconductor device PKG2 of Modification 1, the miniaturization of the semiconductor device PKG2 can be promoted.

Further, in the semiconductor device PKG2 according to Modification 1, as shown in FIG. 14, not only the source electrode SE and the source lead SL are coupled using a plurality of wires W1 but also the upper electrode UE and the chip mounting part TAB are coupled using a plurality of wires W3. As a result, according to Modification 1, moving of the electric charges in the power transistor and the capacitor element coupled in parallel can be made easy, thereby the function of the capacitor element as the bypass route for the high frequency noise can be fully demonstrated. Moreover, by coupling the upper electrode UE and the chip mounting part TAB using the wires W3, it becomes possible to reduce the parasitic resistance and the parasitic inductance in the bypass route. As a result, according to the semiconductor device PKG2 of Modification 1, it becomes possible to suppress an increase in impedance in the bypass route caused by a parasitic resistance and a parasitic inductance between the drain electrode and the upper electrode UE. Thus, according to Modification 1, it becomes possible to suppress both the occurrence of the noise caused by the high frequency noise flowing in the parasitic resistance existing in the bypass route and the occurrence of inhibition of flowing of the high frequency noise into the bypass route caused by the parasitic inductance existing in the bypass route. Thus, according to Modification 1, the technical significance of providing the capacitor element which serves as the bypass route for the high frequency noise can be fully exhibited.

Modification 2

Figure 15:
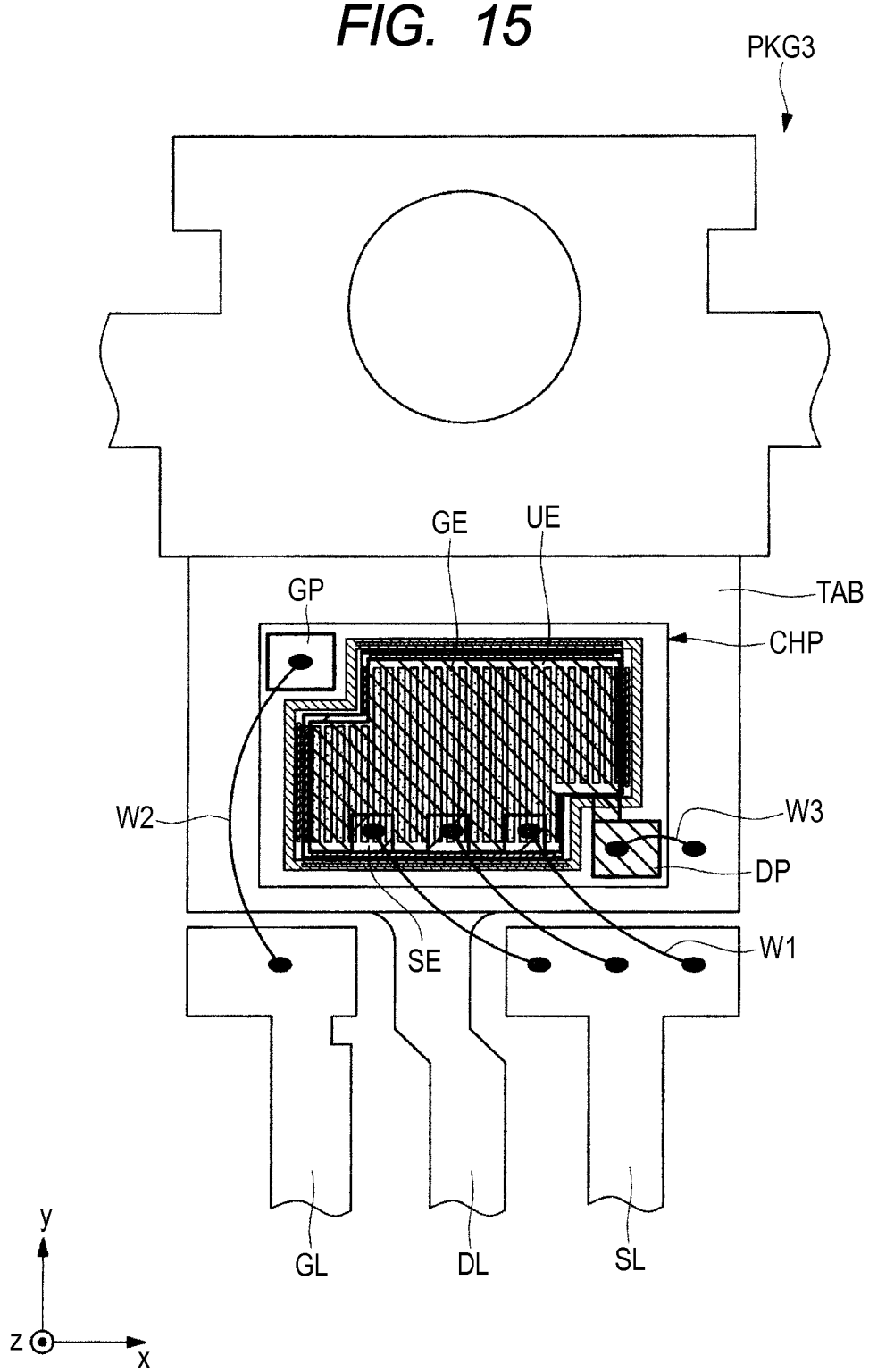
FIG. 15 is a plan view showing a package configuration of a semiconductor device according to Modification 2.

Next, a package configuration of a semiconductor device PKG3 according to Modification 2 will be explained. FIG. 15 is a plan view showing the package configuration of the semiconductor device PKG3 of Modification 2. In FIG. 15, according to Modification 2, the idea of increasing a plane area of the upper electrode UE of the capacitor element as much as possible while suppressing an increase in planar size of the semiconductor chip CHP is embodied. More specifically, as shown in FIG. 15, of the source electrode SE, except for the region to be coupled with a plurality of wires W1, a plane area of the upper electrode UE is made large so as to cover other portions. For example, as shown in FIG. 15, by forming a planar concave and convex form in part of the upper electrode UE, it becomes possible to increase the plane area of the upper electrode UE as much as possible so as to become close to the plane area of the source electrode SE while securing a region of the source electrode SE to be coupled with the wires W1.

Thus, according to Modification 2, the facing area of the source electrode SE and the upper electrode UE can be made larger. As a result, according to Modification 2, the capacitance of the capacitor element provided in the bypass route can be increased. This means that it is possible to allow the bypass route to be in a low-impedance state with respect to the high frequency noise. Thus, according to Modification 2, the technical significance of the capacitor element serving as the bypass route for the high frequency noise can be fully exhibited.

Modification 3

Figure 16:
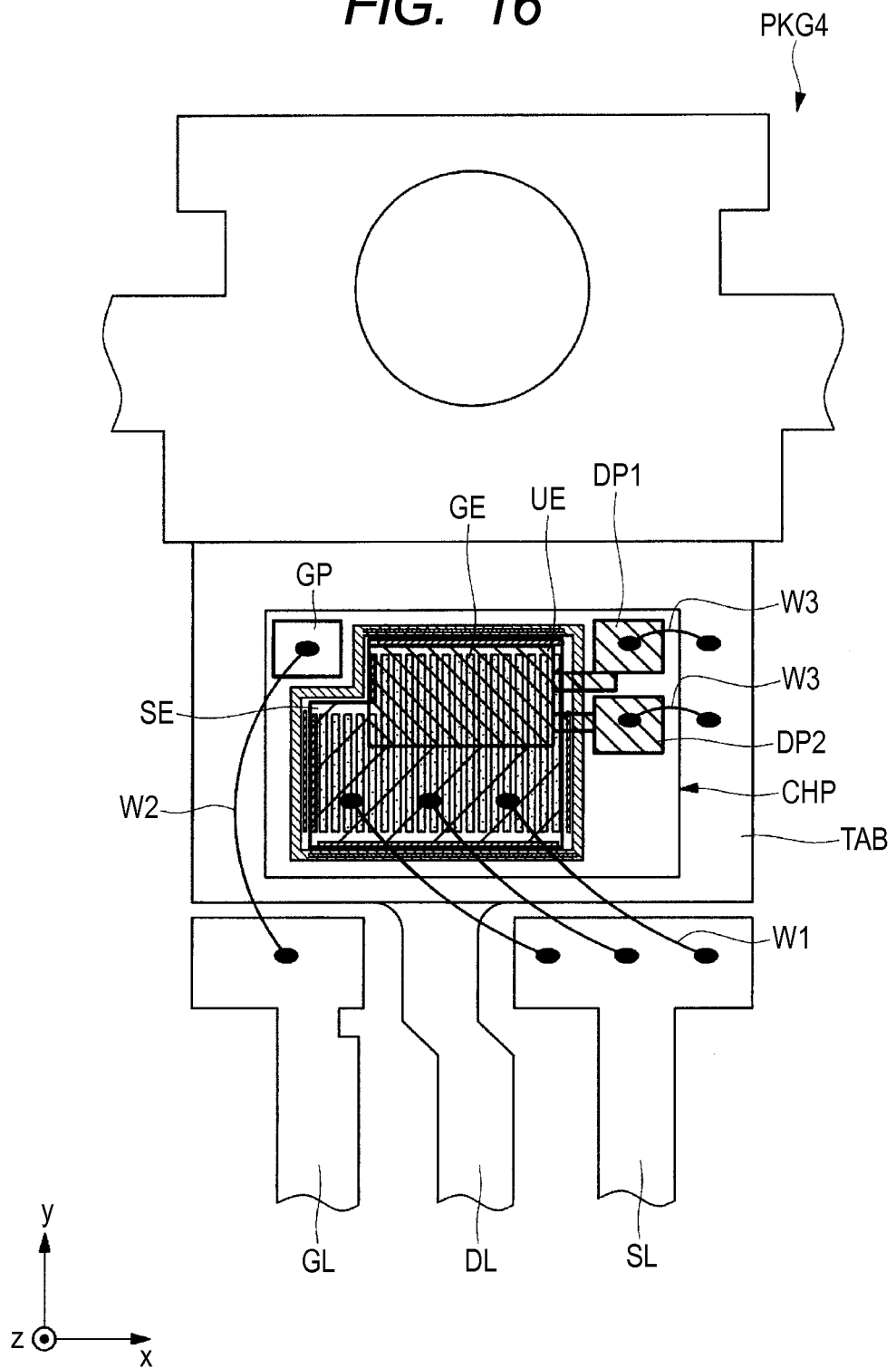
FIG. 16 is a plan view showing a package configuration of a semiconductor device according to Modification 3.

Next, a package configuration of a semiconductor device PKG4 according to Modification 3 will be explained. FIG. 16 is a plan view showing the package configuration of the semiconductor device PKG4 of Modification 3. In FIG. 16, according to Modification 3, a drain pad DP1 and a drain pad DP2 are formed over the surface of the semiconductor chip CHP, and each of the drain pad DP1 and the drain pad DP2 is electrically coupled with the upper electrode UE.

Thus, in Modification 3 also, as in Modification 1, it is possible to suppress an increase in impedance in the bypass route resulting from the parasitic resistance and parasitic inductance between the drain electrode and the upper electrode UE. Thus, in Modification 3 also, it becomes possible to suppress both the occurrence of the noise caused by the high frequency noise flowing in the parasitic resistance existing in the bypass route and the occurrence of inhibition of flowing of the high frequency noise into the bypass route caused by the parasitic inductance existing in the bypass route. As a result, according to Modification 3 also, the technical significance of providing the capacitor element which serves as the bypass route for the high frequency noise can be fully exhibited. In particular, according to Modification 3, such a configuration is adopted that the drain pad DP1 and the drain pad DP2 are provided outside the active region in which the power transistor and the capacitor element are formed and that each of the drain pad DP1 and the drain par DP2 is coupled with the upper electrode UE. Therefore, according to Modification 3, it is possible to fully exhibit the technical significance of providing the capacitor element serving as the bypass route for the high frequency noise while suppressing an impact to the power transistor and the capacitor element in a bonding step of coupling the wire 3 with each of the drain pad DP1 and the drain pad DP3.

Second Embodiment

In First Embodiment described above, while description has been made to the power MOSFET as an example of the power transistor, the technical idea of First Embodiment is not limited thereto but is applicable also to an IGBT (Insulated Gate Bipolar Transistor).

Device Configuration of IGBT

Figure 17:
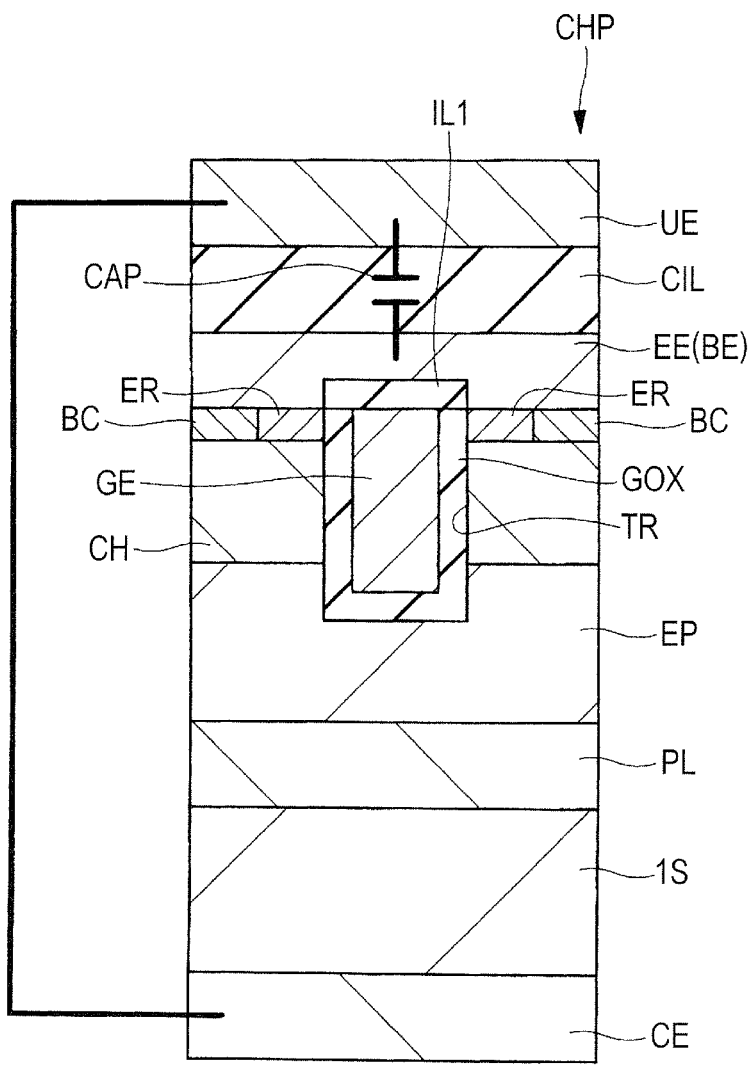
FIG. 17 is a cross-sectional view showing a device configuration of an IGBT according to Second Embodiment.

First, a device configuration of an IGBT will be explained. FIG. 17 is a cross-sectional view showing the device configuration of the IGBT according to Second Embodiment. As shown in FIG. 17, the IGBT has a collector electrode CE (collector electrode pad) formed over the back surface of the semiconductor chip CHP, and a semiconductor substrate 1S (in FIG. 17, a p type semiconductor substrate) is formed over the collector electrode CE. Over the semiconductor substrate 1S, a p type semiconductor layer PL is formed and, over the p type semiconductor layer PL, a drift layer EP is formed. Also, a channel layer CH is formed over the drift layer EP and, further, a trench TR passing through the channel layer CH and reaching the drift layer EP is formed. Further, matching the trench TR, an emitter region ER which includes an n+ type semiconductor region is formed. Inside the trench TR, a gate insulating film GOX including, for example, a silicon oxide film is formed and the gate electrode GE is formed through the gate insulating film GOX. The gate electrode GE includes, for example, a polysilicon film, and is so formed as to fill the trench TR. Further, the body contact region BC is formed over the surface of the channel layer CH adjacent to the emitter region ER.

Subsequently, as shown in FIG. 17, over the emitter region ER and the body contact region BC, an emitter electrode EE including, for example, an aluminum film is so formed as to be in contact with the emitter region ER and the body contact region BC. As a result, the emitter region ER and the body contact region BC are electrically coupled through the emitter electrode EE. That is, according to Second Embodiment also, as shown in FIG. 17, the emitter electrode EE is formed ranging from over the emitter region ER and the body contact region BC to over the gate electrode GE, and the insulating film IL1 is interposed between the emitter electrode EE and the gate electrode GE. As a result, the emitter electrode EE and the gate electrode GE are electrically insulated by the insulating film IL1.

The IGBT thus configured has both a fast-switching characteristic and a voltage drive characteristic of the power MOSFET and a low on-voltage characteristic of a bipolar transistor.

In FIG. 17, the trench gate configuration is shown, which is not limitative. For example, though not shown, it may be an IGBT using a planar gate configuration formed over a silicon substrate.

Operation of IGBT

Next, operations of the IGBT in Second Embodiment will be explained. First, an operation of turning on the IGBT will be explained. As shown in FIG. 17, when a sufficient positive voltage is provided between the gate electrode GE and the emitter region ER, a MOSFET having a trench gate configuration is turned on. In this case, a forward bias is provided between the p type semiconductor layer PL being a collector region and the drift layer EP, and positive hole injection from the p type semiconductor layer PL to the drift layer EP is started. Then, the electrons as many as plus electric charges of the injected positive holes gather in the drift layer EP. As a result, the resistance of the drift layer EP decreases (conductivity modulation) and the IGBT will be turned on.

A junction voltage of the p type semiconductor layer PL and the drift layer EP is added to an on-state voltage. However, due to the conductivity modulation, the resistance value of the drift layer EP falls by one digit or more. Therefore, in high dielectric strength which occupies most of the on-resistance, the IGBT is of a low on-state voltage rather than the power MOSFET is. Therefore, it is seen that the IGBT is a device effective for achieving the high dielectric strength. That is, in the power MOSFET, in order to achieve the high dielectric strength, it is necessary to thicken the epitaxial layer used as a drift layer. In such a case, the on-resistance will also go up. On the other hand, in the IGBT, even if the drift layer EP is made thick for achieving the high dielectric strength, a conductivity modulation arises at the time of an on operation of the IGBT. For this reason, on-resistance can be made lower than the case of the power MOSFET. That is, according to the IGBT, as compared with the power MOSFET, even when trying to achieve the high dielectric strength, the low on-resistance device is realizable.

Next, an operation of turning off the IGBT will be explained. When the voltage between the gate electrode GE and the emitter region ER is reduced, the MOSFET having the trench gate configuration is turned off. In this case, the positive hole injection from the p type semiconductor layer PL to the drift layer EP is stopped. Further, positive holes already injected have run out of their lifetime and are reduced in number. Remaining positive holes have directly flown onto the emitter electrode EE side (tail current). When the flow has been completed, the IGBT will be in an off state. Thus, it becomes possible to turn on/off the IGBT.

Distinctive Features of Second Embodiment

As described above, the IGBT being an example of the power transistor is formed in the semiconductor chip of Second Embodiment. In Second Embodiment also, the capacitor element CAP is arranged over the IGBT in a laminated manner in the thickness direction of the semiconductor chip.

More specifically, as shown in FIG. 17, the capacitor insulating film CIL is formed over the emitter electrode EE of the IGBT and, over the capacitor insulating film CIL, the upper electrode UE is formed.

As a result, in the semiconductor chip CHP according to Second Embodiment, there is formed the capacitor element CAP using the emitter electrode EE as the lower electrode and including the capacitor insulating film CIL formed over the lower electrode and the upper electrode UE formed over the capacitor insulating film CIL. That is, in the semiconductor chip CHP according to Second Embodiment also, there is formed, in the upper portion of the IGBT, the capacitor element CAP using the emitter electrode EE also as the lower electrode. That is, in the semiconductor chip CHP of Second Embodiment, while adopting the configuration where the emitter electrode EE of the IGBT also serves as the lower electrode of the capacitor element CAP, in the thickness direction of the semiconductor chip CHP, the IGBT and the capacitor element CAP are arranged in a laminated manner.

The upper electrode UE of the capacitor element CAP is electrically coupled with the collector electrode CE of the IGBT. Therefore, in the semiconductor chip CHP of Second Embodiment, there is formed a device configuration (the IGBT and the capacitor element CAP) which embodies the circuit configuration of FIG. 1B.

Thus, Second Embodiment also has, as in First Embodiment, the first, second, and third distinctive features which are described above. As a result, in Second Embodiment also, while arranging the IGBT and the capacitor element CAP in a laminated manner in the thickness direction of the semiconductor chip CHP, it is possible to achieve the circuit configuration where the capacitor element CAP is coupled between the collector electrode CE of the IGBT and the emitter electrode EE. Further, according to the semiconductor device of Second Embodiment, even if a capacitor element is added, without sacrificing the miniaturization of the semiconductor device, improvement in performance of the semiconductor device can be achieved. That is, according to Second Embodiment, it is possible to obtain a prominent effect of providing a low-noise semiconductor device while suppressing an increase in its planar size.

While the invention made by the present inventors has been described specifically with reference to the preferred embodiments, it will be apparent that the invention is not limited to them but can be modifies variously within a range not departing the gist thereof.

While the description has been made for the embodiments described above to the power MOSFET and the IGBT as examples of the power transistor, the technical idea of the embodiments described above is not limited thereto but is widely applicable also to a so-called vertical type device where a current is made to flow in the thickness direction of the semiconductor chip. For example, it is applicable also to the junction FET where on and off of an electric current is controlled by controlling the width of the depletion layer extending from the gate electrode.

In Second Embodiment, the power transistor containing silicon (Si) as the main material has been described. However, the technical idea of Second Embodiment is not limited to the above. For example, it can be applied to a power transistor mainly containing a material whose band gap is greater (wide band-gap material) than silicon represented by a silicon carbide (SiC) and a gallium nitride (GaN). However, in the power transistor mainly containing gallium nitride (GaN), there is generally employed a planar type device which uses two-dimensional electron gas (2DEG) locally existing in a well-type potential produced in the interface of a channel layer (electron transit layer) (for example, GaN) and an electron supply layer (for example, AlGaN). For this reason, the technical idea of Second Embodiment applied to the vertical type device is particularly effective when applied to the vertical type device containing silicon (Si) or silicon carbide (SiC) as the main material.

What is claimed is:

1. A semiconductor device comprising:
   a semiconductor chip; and
   a power transistor and a capacitor element electrically coupled with the power transistor formed on the semiconductor chip,
   wherein the power transistor includes:
   an source electrode and a drain electrode spaced from each other in a thickness direction of the semiconductor chip; and
   a gate electrode which controls turning on/off a current flowing between the drain electrode and the source electrode,
   wherein the capacitor element includes:
   the source electrode as a lower electrode;
   a capacitor insulating film formed over the source electrode; and
   an upper electrode formed over the capacitor insulating film and electrically coupled with the drain electrode,
   wherein the source electrode and the upper electrode have an overlapping portion in a plan view,
   wherein a gate pad electrically coupled with the gate electrode, the source electrode, and the upper electrode are formed over a main surface of the semiconductor chip, and
   wherein, in the plan view, over the main surface of the semiconductor chip, an upper electrode exposure region, where the upper electrode is exposed, and a source electrode exposure region, where the source electrode is exposed, are formed, and the gate pad is exposed.

2. The semiconductor device according to claim 1, wherein the upper electrode is contained in the source electrode in the plan view.

3. The semiconductor device according to claim 1, wherein the power transistor and the capacitor element are arranged in a laminated manner in the thickness direction of the semiconductor chip.

4. The semiconductor device according to claim 1, wherein the power transistor comprises:
   a semiconductor substrate;
   the drain electrode formed over a back surface of the semiconductor substrate;
   a drift layer formed over a main surface of the semiconductor substrate;
   a channel layer formed over the drift layer;
   a trench passing through the channel layer and reaching the drift layer;
   a gate insulating film formed over an inner wall of the trench;
   a gate electrode embedded in the trench through the gate insulating film;
   a source region in contact with the trench and formed over a surface of the channel layer; and
   the source electrode electrically coupled with the source region.

5. The semiconductor device according to claim 4,
   wherein the source electrode is formed ranging from over the source region to over the gate electrode, and
   wherein an insulating film is interposed between the source electrode and the gate electrode.

6. The semiconductor device according to claim 1 comprising:
   a chip mounting part; and
   the semiconductor chip mounted over the chip mounting part, and
   wherein the drain electrode is formed over a back surface of the semiconductor chip.

7. The semiconductor device according to claim 6, comprising:
   a drain lead joined to the chip mounting part;
   a source lead spaced from the chip mounting part; and
   a gate lead spaced from the chip mounting part.

8. The semiconductor device according to claim 7,
wherein the source electrode exposure region and the source lead are coupled by a first conductive member,
wherein the gate pad and the gate lead are coupled by a second conductive member, and
wherein the upper electrode exposure region and the chip mounting part are coupled by a third conductive member.

9. The semiconductor device according to claim 8,
wherein the source electrode exposure region and the source lead are coupled by a plurality of first conductive members, and
wherein the upper electrode exposure region and the chip mounting part are coupled by a plurality of third conductive members.

10. The semiconductor device according to claim 7,
wherein the source electrode exposure region and the source lead are coupled by a first conductive member,
wherein the gate pad and the gate lead are coupled by a second conductive member,
wherein a drain pad electrically coupled with the upper electrode is exposed over the surface of the semiconductor chip, and
wherein the drain pad and the chip mounting part are coupled by a third conductive member.

11. The semiconductor device according to claim 10, wherein the plural drain pads electrically coupled with the upper electrode over the surface of the semiconductor chip are present.

12. The semiconductor device according to claim 1, wherein a film thickness of the capacitor insulating film is 50 nm or more and 250 nm or less.

13. A semiconductor device comprising:
a semiconductor chip; and
a power transistor and a capacitor element electrically coupled with the power transistor formed on the semiconductor chip,
wherein the power transistor includes:
an emitter electrode and a collector electrode spaced from each other in a thickness direction of the semiconductor chip; and
a gate electrode which controls turning on/off a current flowing between the collector electrode and the emitter electrode,
wherein the capacitor element includes:
the emitter electrode as a lower electrode;
a capacitor insulating film formed over the emitter electrode; and
an upper electrode formed over the capacitor insulating film and electrically coupled with the collector electrode, and
wherein the emitter electrode and the upper electrode have an overlapping portion in a plan view,
wherein a gate pad electrically coupled with the gate electrode, the emitter electrode, and the upper electrode are formed over a main surface of the semiconductor chip, and
wherein, in the plan view, over the main surface of the semiconductor chip, an upper electrode exposure region, where the upper electrode is exposed, and an emitter electrode exposure region, where the emitter electrode is exposed, are formed, and the gate pad is exposed.

14. The semiconductor device according to claim 13, wherein the power transistor is an insulated gate bipolar transistor.

15. A method of manufacturing a semiconductor device comprising a power transistor and a capacitor element electrically coupled with the power transistor,
wherein the power transistor includes:
a source electrode and a drain electrode spaced from each other; and
a gate electrode which controls turning on/off a current flowing between the drain electrode and the source electrode,
wherein the capacitor element includes:
the source electrode as a lower electrode;
a capacitor insulating film formed over the source electrode; and
an upper electrode formed over the capacitor insulating film and electrically coupled with the drain electrode, and
wherein the source electrode and the upper electrode have an overlapping portion in a plan view,
wherein a gate pad electrically coupled with the gate electrode, the source electrode, and the upper electrode are formed over a main surface of the semiconductor chip, and
wherein, in the plan view, over the main surface of the semiconductor chip, an upper electrode exposure region, where the upper electrode is exposed, and a source electrode exposure region, where the source electrode is exposed, are formed, and the gate pad is exposed,
the method comprising the steps of:
(a) providing a semiconductor substrate having a drift layer formed over a surface thereof and a channel layer formed over the drift layer;
(b) forming a trench passing through the channel layer and reaching the drift layer;
(c) forming a gate insulating film over an inner wall of the trench;
(d) forming a gate electrode to be embedded in the trench through the gate insulating film;
(e) after the step (d), forming a source region over a surface of the channel layer so as to be in contact with the trench;
(f) after the step (e), forming an insulating film covering an upper surface of the gate electrode;
(g) after the step (f), forming the source electrode to be coupled with the source region;
(h) forming the capacitor insulating film over the source electrode;
(i) forming the upper electrode over the capacitor insulating film; and
(j) forming the drain electrode over a back surface of the semiconductor substrate.

\* \* \* \* \*